United States Patent
Ng et al.

(10) Patent No.: US 7,217,650 B1
(45) Date of Patent: May 15, 2007

(54) METALLIC NANOWIRE INTERCONNECTIONS FOR INTEGRATED CIRCUIT FABRICATION

(75) Inventors: Hou Tee Ng, Mountain View, CA (US); Jun Li, Sunnyvale, CA (US); Meyya Meyyappan, San Jose, CA (US)

(73) Assignee: The United States of America as represented by the Administrator of the National Aeronautics and Space Administration (NASA), Washington, DC (US)

( * ) Notice: Subject to any disclaimer, the term of this patent is extended or adjusted under 35 U.S.C. 154(b) by 0 days.

(21) Appl. No.: 10/816,576

(22) Filed: Mar. 24, 2004

Related U.S. Application Data

(63) Continuation-in-part of application No. 10/390,254, filed on Mar. 11, 2003, now Pat. No. 7,094,679.

(51) Int. Cl.
*H01L 21/4763* (2006.01)

(52) U.S. Cl. ............ 438/622; 438/691; 977/842; 977/843; 257/E21.495

(58) Field of Classification Search .......... 438/622, 438/691; 977/742, 762, 890–891, 842, 843
See application file for complete search history.

(56) References Cited

U.S. PATENT DOCUMENTS

| | | | |
|---|---|---|---|
| 6,231,744 B1 | 5/2001 | Ying et al. | 205/324 |
| 6,359,288 B1 | 3/2002 | Ying et al. | 257/14 |
| 6,407,922 B1 | 6/2002 | Eckblad et al. | 361/704 |
| 6,432,740 B1 | 8/2002 | Chen | 438/99 |
| 6,538,367 B1 | 3/2003 | Choi et al. | 313/309 |
| 6,803,260 B2 | 10/2004 | Shin et al. | 438/142 |
| 6,831,017 B1 | 12/2004 | Li et al. | 438/694 |
| 6,956,016 B2 | 10/2005 | Searls et al. | 510/296 |
| 6,958,216 B2 | 10/2005 | Kelley et al. | 435/6 |
| 2001/0030366 A1* | 10/2001 | Nakano et al. | 257/758 |
| 2002/0145194 A1 | 10/2002 | O'Connor et al. | 257/712 |
| 2003/0111333 A1 | 6/2003 | Montgomery et al. | 204/164 |

(Continued)

FOREIGN PATENT DOCUMENTS

EP  1329953  8/2003

(Continued)

OTHER PUBLICATIONS

L. Delzeit, et al, "Directed Growth of Single-Walled Carbon Nanotubes" International Journal of Nanoscience, 2002, vol. 1, Nos. 3 & 4, 197-204, World Scientific Publishing Co.

(Continued)

*Primary Examiner*—Thanh Nguyen
(74) *Attorney, Agent, or Firm*—John F. Schipper; Robert M. Padilla; Diana N. Cox

(57) ABSTRACT

A method for fabricating an electrical interconnect between two or more electrical components. A conductive layer is provided on a substarte and a thin, patterned catalyst array is deposited on an exposed surface of the conductive layer. A gas or vapor of a metallic precursor of a metal nanowire (MeNW) is provided around the catalyst array, and MeNWs grow between the conductive layer and the catalyst array. The catalyst array and a portion of each of the MeNWs are removed to provide exposed ends of the MeNWs.

13 Claims, 5 Drawing Sheets

U.S. PATENT DOCUMENTS

| | | |
|---|---|---|
| 2003/0117770 A1 | 6/2003 | Montgomery et al. ...... 361/687 |
| 2003/0189202 A1* | 10/2003 | Li et al. ........................ 257/14 |
| 2003/0231471 A1 | 12/2003 | De Lorenzo et al. ....... 361/719 |
| 2004/0013598 A1 | 1/2004 | McElrath et al. ........ 423/447.2 |
| 2004/0071951 A1* | 4/2004 | Jin ............................. 428/323 |
| 2004/0099208 A1 | 5/2004 | Kang et al. .................... 117/84 |
| 2004/0150311 A1 | 8/2004 | Jin ............................. 313/309 |
| 2004/0250753 A1 | 12/2004 | Kang et al. .................... 117/92 |

FOREIGN PATENT DOCUMENTS

| | | |
|---|---|---|
| WO | WO/2003/054958 | 7/2003 |
| WO | WO/2003/072679 | 9/2003 |
| WO | WO/2003/107419 | 12/2003 |

OTHER PUBLICATIONS

H. Hwang, et al, "Simulations and Experiments of Etching of Silicon in HBr Plasmas for High Aspect Ratio Features," J. Vac. Sci. Technol., 2002, 2199, vol. B 20, Amer Vac Soc.

B. Wei, R. Vajtai, and P. Ajayan, "Reliability and Current Carrying Capacity of Carbon Nanotubes," Applied Physics Letters, Aug. 20, 2001, 1172-1174, vol. 79, No. 8, AIP.

A. Ural, et al, "Electric-Field-Aligned Growth of Single-Walled Carbon Nanotubes on Surfaces," Applied Physics Letters, Oct. 28, 2002, 3464-3466, vol. 81, No. 18, AIP.

* cited by examiner

METALLIC NANOWIRE INTERCONNECTIONS FOR INTEGRATED CIRCUIT FABRICATION

CROSS REFERENCE TO RELATED APPLICATIONS

This application is a Continuation In Part of, and claims the benefit of, a patent application, U.S. Ser. No. 10/390,254, filed Mar. 11, 2003 now U.S. Pat. No. 7,094,674.

ORIGIN OF THE INVENTION

The invention described herein was made by employees of the United States Government and may be manufactured and used by or for the Government for governmental purposes without the payment of any royalties thereon or therefor.

TECHNICAL FIELD

The present invention is a method for providing electrical interconnects for integrated circuit fabrication.

BACKGROUND OF THE INVENTION

An interconnect in an integrated circuit (IC) distributes clock, regulatory and other signals as well as power or ground voltages to various components and circuits on a chip. The International Technology Roadmap for Semiconductors (ITRS) emphasizes the high speed transmission requirements on a chip as the driver for future interconnect development. Near term and long term interconnect requirements for microprocessors (MPs) and for dynamic random access memories (DRAMs) are outlined in the ITRS. Microprocessors require local, intermediate and global wiring solutions and present both material and processing difficulties. Susceptibility of common interconnect metals to electro-migration at high current densities (above $10^6$ Amp/$cm^2$) is a problem. Copper interconnect, introduced in 1998, is now routinely used, with minimum feature size down to 90 nm. However, electrical resistivity of copper increases with decreasing dimensions and is attributed to scattering at surfaces and at grain boundaries. These size effects are due to interface roughness and through use of small grain sizes, which are hard to overcome and cannot be avoided by simply cooling to lower the resistivity. With reference to processing, present interconnect technology relies upon successful development of three processes: dry etching to create trenches and vias; deposition to fill metal plugs; and planarization. The aspect ratio of contact apertures is now 12:1 and may reach 23:1 by the year 2016. Creating high aspect ratio apertures with straight walls and uniform diameters using dry etching is an extremely difficult task and is expected to become progressively more difficult with each succeeding generation. HBr etching of $SiO_2$ for a 9:1 aspect ratio contact hole has been found to provide a 135 mm diameter at one end and a 70 nm diameter at the other end of the hole by Hwang, Meyyappan, Mathod and Ranade, Jour. Vac. Sci. Technol., vol. 20B (2002) 2199. Aspect ratio-dependent etching becomes a serious problem with each new decrease in feature size. Plasma damage and cleaning of high aspect ratio features also pose concerns. Void-free filling of a high aspect ratio aperture is another concern.

Well known properties of copper such as high current carrying capacity and material robustness, would make copper ideally suited for use in electrical interconnects, if the fabrication problems could be resolved.

An electrical interconnect in an integrated circuit (IC) chip uses some form of metallization. Interconnect technology that, as presently practiced, depends upon at least processing three steps: (1) creating a trench of the right size in an insulator material, such as $SiO_2$ or another dielectric, using a procedure such as dry etching; (2) filling the trench with an appropriate interconnect metal material; and (3) chemical mechanical polishing (CMP) to obtain a planar surface. Creating deep, narrow trenches with flat side walls (step (1)) stretches the capabilities of dry etching equipment and processes. Cleaning a trench after its creation is also a problem, in part because of the shrinking width of the trench. Filling a deep, narrow trench with an interconnect metal, in a manner that does not create voids, is also becoming a problem. The combination of these difficulties makes the interconnect technology a critical technical area, according to the ITRS, which requires substantial innovation in material, design and associated processes.

Transistor node size is being reduced with each successive generation including the source, drain and gate contacts. Provision of good Ohmic contacts for these nodes are crucial for fast, reliable device performance.

What is needed is an approach that provides small diameter electrical interconnects, with a metal-like material such as copper or a suitable alloy, that does not suffer from the difficulties of trench creation and trench filling discussed in the preceding. Preferably, the approach should (1) provide reasonably uniform diameter nanowires with aspect ratios up to or higher than 100:1, (2) allow use of a variety of gap-filling insulating materials, (3) allow use of current densities of $10^6$ Amps/$cm^2$ and higher without serious electro-migration problems, (4) show substantially no degradation at moderate or high current densities over long time intervals, and (5) generally meet DRAM and microprocessor requirements. Preferably, the approach should be flexible and allow interconnects with a range of small diameters to be created and allows some flexibility in the choice of composition for the interconnect material.

SUMMARY OF THE INVENTION

These needs are met by the invention, which preferentially grows metallic nanowires (MeNWs) at a selected pattern of spaced apart locations between a conductive surface that is deposited on a substrate and a patterned catalyst array, using lithography or a similar process to define the MeNW growth locations (as MeNW pillars). An insulation layer (e.g., Si, $Si_aO_b$ or $Si_cN_d$) is deposited around the catalyst patterned array and the MeNW pillars, to fill the gaps between adjacent MeNW pillars, and chemical mechanical polishing is applied to remove the catalyst patterned array, a portion of the MeNW growth layer and a portion of the insulation layer, to provide exposed ends of the MeNW pillars.

A metallic nanowire has a diameter in a range of about 1–250 nm, may be a metal silicide or a suitable metal or alloy (Cu, Ag, Au, Pd, Pt, Ni, Fe, Co, Ir, Ti, Zr,), and is preferably substantially solid rather than hollow, as a carbon nanotube is hollow.

MeNW growth may use a vapor-liquid-solid process. For example, a copper oxide structure can be grown and reduced to copper to provide a one-dimensional MeNW. The material may be grown as a metal or metallic nanowire. At the end of the growth step, an array of one or more MeNWs is provided. Before growth of the MeNWs, a thin, patterned layer of an appropriate catalyst material, such as Al, Au, Ag, Ni, Ir, Mo, Pt or Pd, is deposited on the substrate surface, to tailor the electrical conductivity and to direct the nanowire growth in a desired pattern.

A second step, corresponding to trench filling, fills most or all of the core regions within one or more MeNW structures with $Si_aO_b$, $Si_cN_d$, or other insulating material, using standard approaches. For example, $SiO_x$ deposition can be performed using tetraethylorthosilicate chemical vapor deposition (TEOS-CVD). A subsequent step, involving CMP, can be performed conventionally. Multi-level interconnects can be constructed using this approach.

BRIEF DESCRIPTION OF DRAWINGS

FIGS. 3A–3F illustrate suitable array patterns for a catalyst layer used in the invention.

DESCRIPTION OF BEST MODES OF THE INVENTION

Figure 1A:
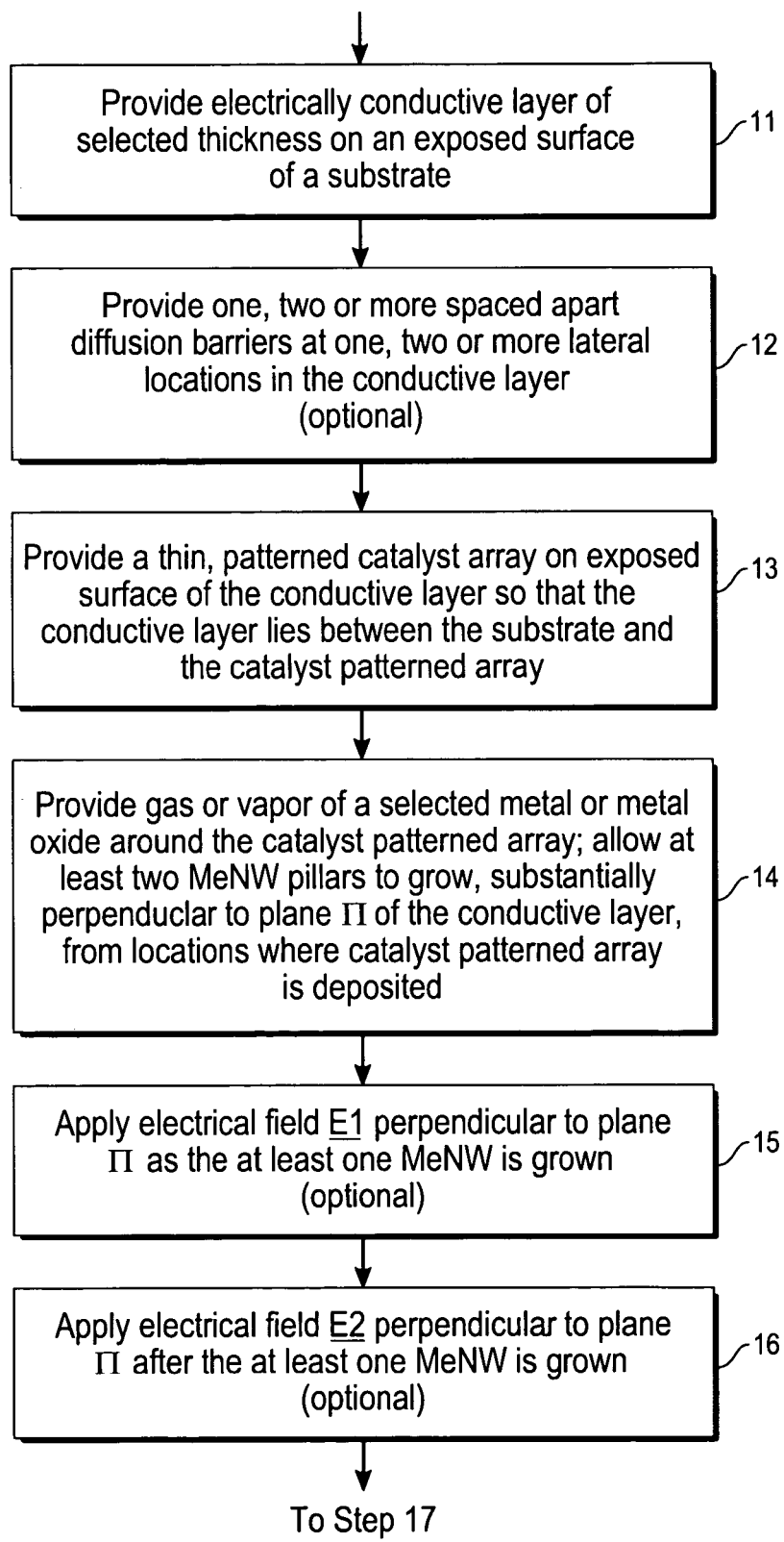
FIG. 1A/1B illustrates is a flow chart illustrating a procedure for practicing the invention.
Figure 2A:
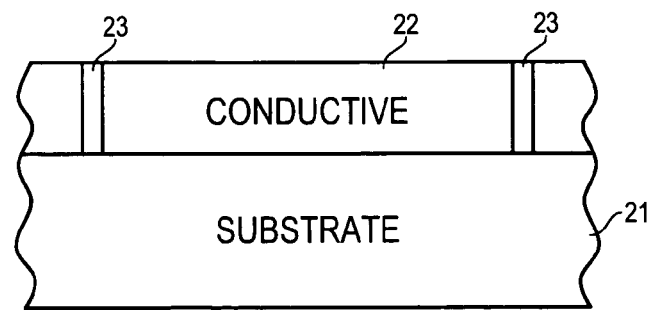
FIGS. 2A–2F illustrate the procedure set forth in FIG. 1.

FIG. 1A/1B is a flow chart of a procedure for practicing the invention. In step 11 (illustrated in FIG. 2A), an electrically conductive layer 22, preferably having a thickness in the range 0.2–250 nm, is provided on an exposed surface of a substrate 21, which may have any reasonable thickness. The substrate material may be silicon or a silicon on insulator, and the conductive layer material may be Cu, Ag, Au, Pd, Pt, Ni, Fe, Co, Ir, Ti, Zr, and/or a metal-doped silicide. Optionally, two or more spaced apart diffusion barriers 23 of a selected barrier material (e.g., $Ti_uN_v$ or $Ta_uN_v$ of thickness 1–10 nm, where u and v are positive numbers) is provided at one, two or more laterally displaced locations in the conductive layer 22, to limit transverse movement of the conductive layer material, in step 12.

In step 13 (illustrated in FIG. 2B), a thin, patterned array 24 of MeNW catalyst elements, preferably having thicknesses of 0.1–20 nm, is provided on an exposed surface of the conductive layer 22 so that a portion of the conductive layer lies between the substrate 21 and an element of the catalyst array 24. The catalyst patterned array 24 is patterned as a collection of one or more "islands" of catalyst material that is partly or fully surrounded by a region where no catalyst is deposited. The catalyst material may be Al, Au, Ag, Ni, Ir, Mo, Co, Pt and/or Pd.

An array of islands of catalyst material can be formed, for example, by providing a continuous film (of thickness 0.1–20 nm) and applying heat at a temperature of 500–800° C. to disintegrate the catalyst film into a plurality of random islands of catalyst material, each having a diameter in a range 100–300 nm and each being spaced apart from adjacent islands of catalyst material by a distance in a range of 100–300 nm. More generally, a nearest neighbor spacing between islands can range from 30 nm to 10 μm, depending upon the desired application.

Figure 1B:
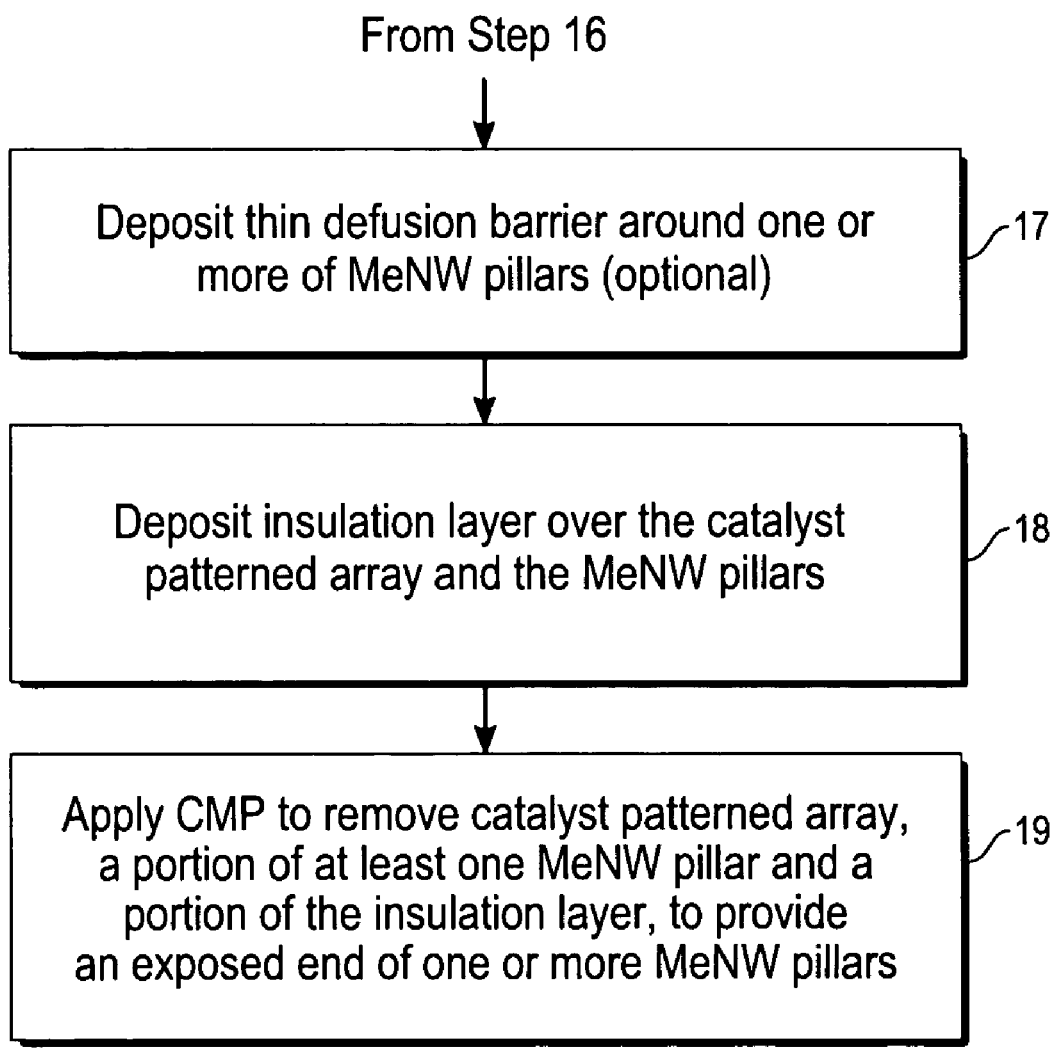

In step 14 (illustrated in FIG. 2C), a gas or vapor of a selected metal or metal oxide, such as Cu, Ag, Au, Pt or Pd, is introduced around the catalyst in the catalyst layer 24, at a temperature in a preferred range T=500–1200° C. and at a pressure in a preferred range p=0.1–5 Torr, and substantially solid metallic nanowires ("MeNWs") are allowed to grow as MeNW pillars from the regions where catalyst material is deposited. Growth of MeNW pillars 25 occurs between, and pushes apart, the conductive layer 22 and the catalyst patterned array 24. The MeNW gas/vapor may be provided by thermal CVD or by plasma-enhanced CVD. Where the lengths L(MeNW) of the MeNWs are not too large (e.g., L(MeNW)≦20–50 μm), the individual MeNWs will tend to grow approximately as individual "pillars" perpendicular to a plane Π in the originally-exposed surface of the conductive layer and will not coalesce. For lengths L(MeNW) greater than about 50 μm, the MeNW pillars 25 will tend to bend and to grow partly in a horizontal direction, roughly parallel to the plane Π. Preferably, between any two adjacent MeNW pillars 25, a gap having no solid material exists.

Where an electrical field E1, (having a selected intensity in a range such as 20 volts/cm≦|E|≦5,000 volts/cm) is oriented substantially perpendicular to the plane Π, is applied during MeNW growth (optional step 15 in FIG. 1, illustrated in FIG. 2C), the lengths L(MeNW) for which the MeNW pillars grow perpendicular to the plane Π can be extended to an estimated 200 μm, or perhaps higher.

In optional step 16 (illustrated in FIG. 2C), a transversely oriented electrical field E2 is applied after step 15 and before step 18 to encourage the MeNW pillars to bend and subsequently grow partly or wholly oriented in a horizontal direction, parallel to the plane Π, so that MeNW pillars that are near each other can be caused to grow in a selected horizontal direction.

In optional step 17 (illustrated in FIG. 2D), a thin diffusion barrier 26 (e.g., $Ti_uN_v$ or $Ta_uN_v$, of a thickness 1–10 nm, where u and v are positive numbers) is deposited around one or more of the exposed surfaces of the MeNW pillars 25.

In step 18 (illustrated in FIG. 2E), a thin insulation layer 27 of silicon, silicon oxide or silicon nitride is deposited over an exposed surface of the catalyst layer, covering the catalyst and filling the gaps between the MeNW pillars 25 that grow from the exposed surface.

In step 19 (illustrated in FIG. 2F), chemical mechanical polishing ("CMP") is applied to all of the catalyst patterned array 24, to a portion of the MeNW pillars 25 and to a portion of the insulation layer 27 to provide a reasonably planar surface 28 in which an end of at least one of the MeNW pillars 25 is exposed. The exposed ends of the MeNW pillars 25 are then available to serve as electrical interconnects between two or more electrical components. An MeNW may have an aspect ratio as large as 50:1, or larger if desired. The steps 13–19 can be repeated to provide multiple levels of electrical interconnects, using a planarized device as shown in FIG. 2F as a new substrate for each level.

Figure 2B:
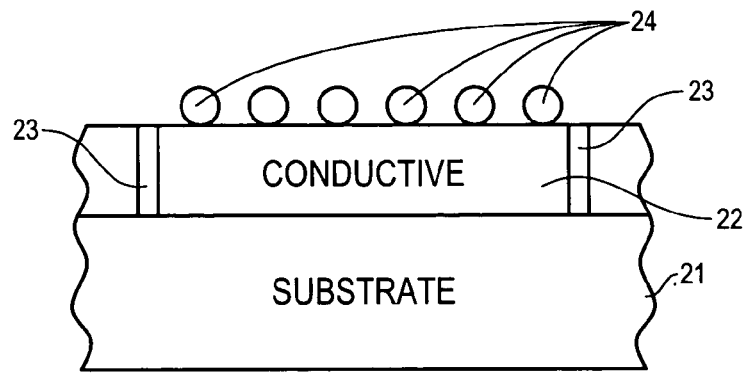
Figure 2C:
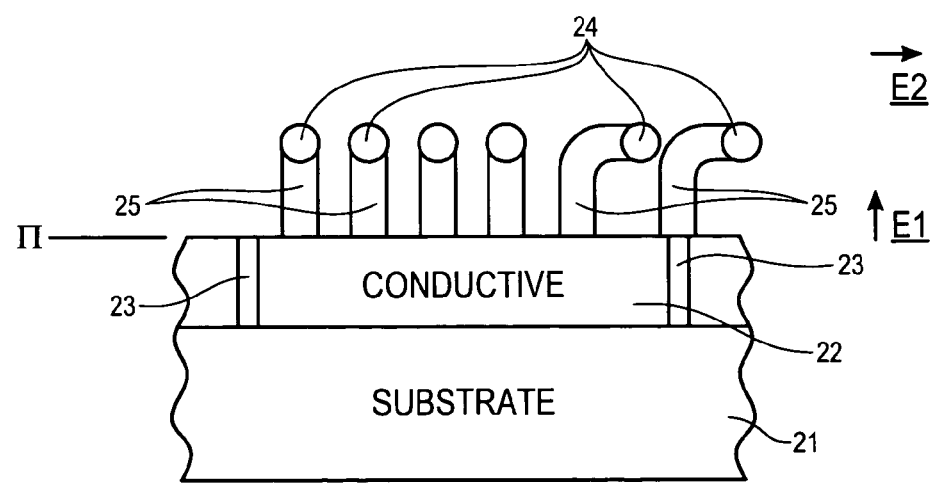
Figure 2D:
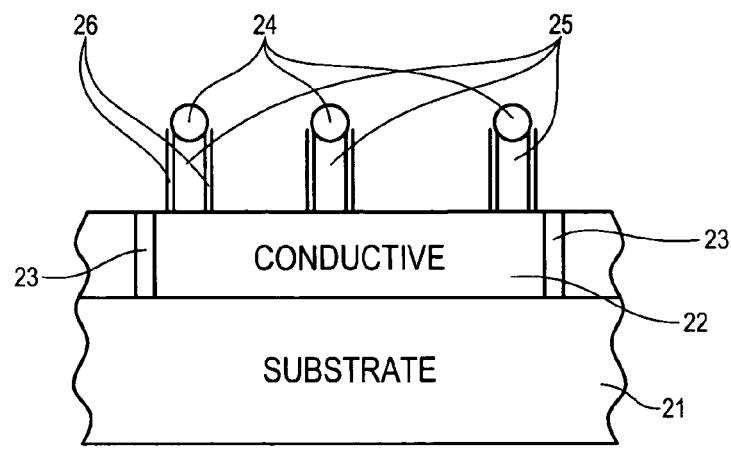
Figure 2E:
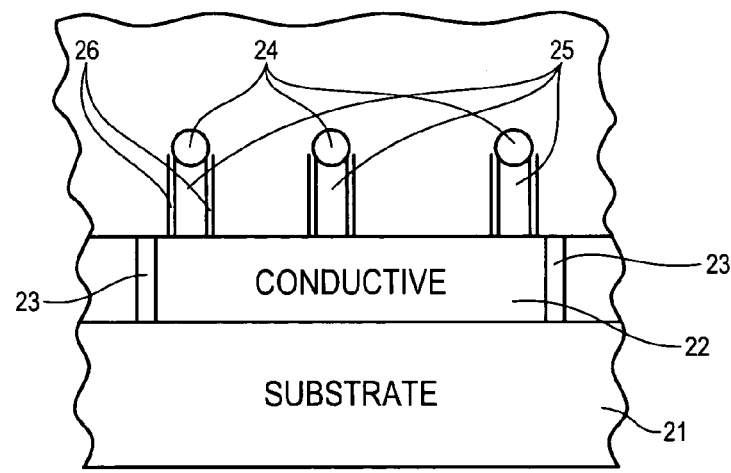
Figure 2F:
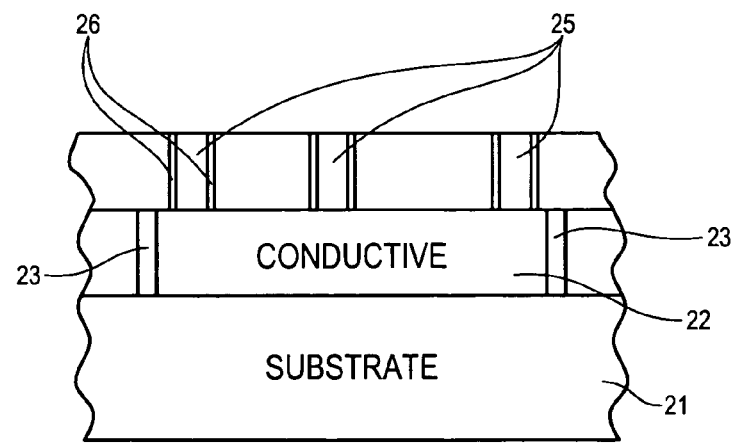
Figures 3A, 3B, 3C, 3D, 3E, 3F:
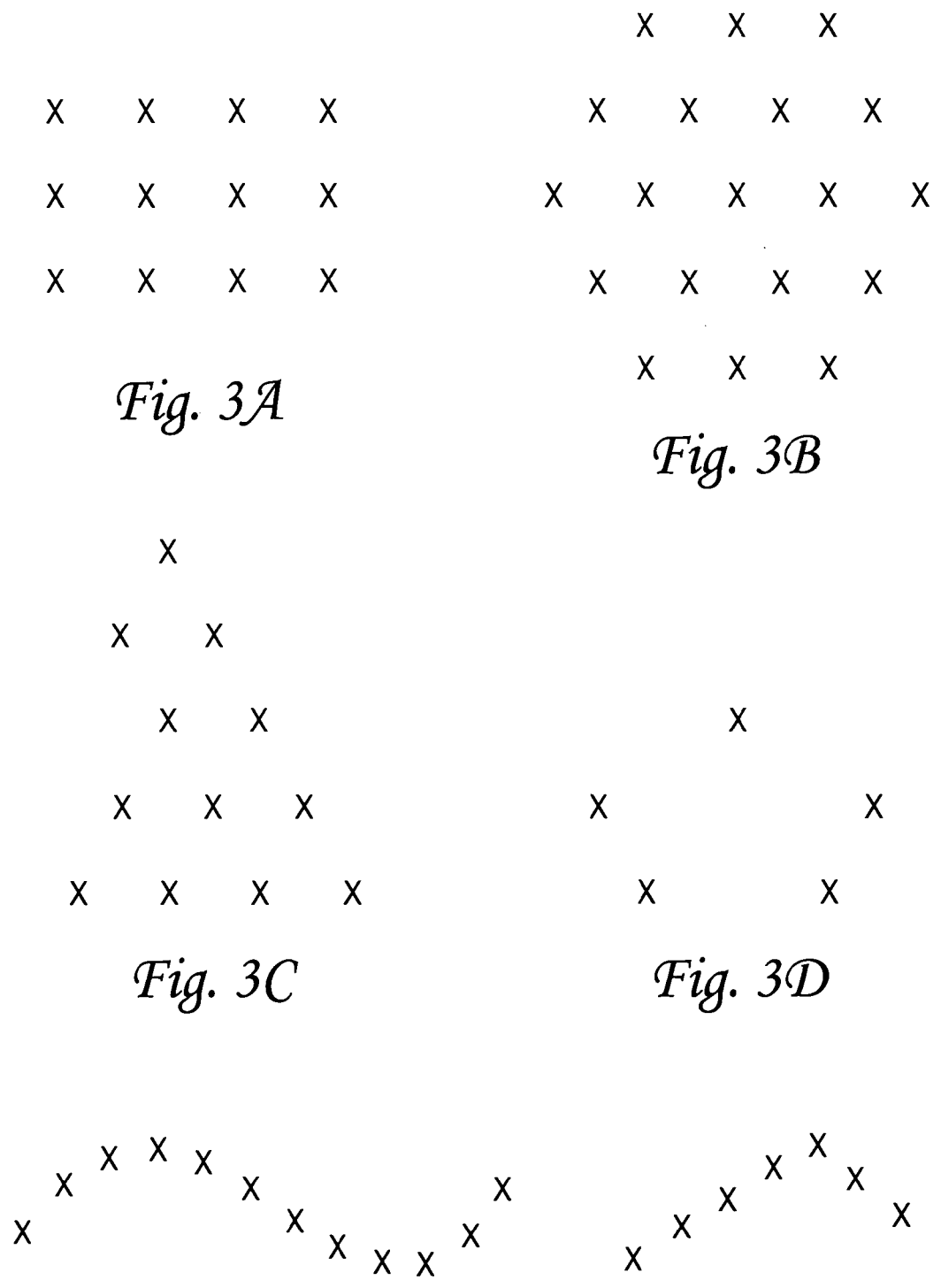

FIG. 3A (rectangular array), FIG. 3B (triangular array), FIG. 3C (interstitial pyramid array), FIG. 3D (pentagonal array, or more generally a polygonal array), and FIGS. 3E and 3F (undulating linear and curvilinear arrays) illustrate some of the patterns in which the catalyst patterned array 24 can be deposited in FIG. 2B.

What is claimed is:

1. A method for fabricating an electrical connection, the method comprising:

providing an electrically conductive layer of a second selected material, having a second selected thickness, in a first selected pattern having at least first and second spaced apart conductive layer components, on an exposed surface of the non-conductive layer;

depositing a catalyst array, including at least first and second spaced apart catalyst array elements, of metallic nanowire ("MeNW") catalyst material of a selected catalyst thickness on the respective first and second conductive layer components;

providing a gas or vapor of a selected metallic material around the catalyst array, and allowing at least first and second MeNWs to grow, substantially perpendicular to a plane Π of the conductive layer on the respective first and second conductive layer components;

providing a diffusion barrier of a selected barrier material as a thin coating surrounding a side wall of the at least two MeNWs and overlying exposed portions of the conductive layer, to prevent migration of the conductive layer material;

depositing an insulation layer of a selected insulation material over the exposed portions of the conductive layer and around the at least two MeNWs so that an interstitial region between the at least two MeNWs contains the insulation material; and applying a chemical mechanical polishing process to remove a fraction of each of the at least two MeNWs, and a fraction of the insulation layer so that each of the at least two MeNWs has an end exposed.

2. The method of claim 1, further comprising applying an electrical field E1, substantially perpendicular to said plane Π, as said at least two MeNWs is grown.

3. The method of claim 1, further comprising applying an electrical field E2, substantially parallel to said plane Π, as said at least two MeNWs is grown.

4. The method of claim 1, further comprising selecting said diffusion barrier material from the materials $Ti_xN_y$ and $Ta_xN_y$, where x and y are positive numbers.

5. The method of claim 1, further comprising selecting said diffusion barrier material from the materials $Ti_xN_y$ and $Ta_xN_y$, where x and y are positive numbers.

6. The method of claim 1, further comprising selecting said conductive layer material from a group of materials that includes Cu, Ag, Au, Pt, Pd, Ni, Fe, Co, Ir, Ti, Zr and a metal-doped silicide.

7. The method of claim 1, further comprising selecting said catalyst layer material from a group of materials that includes Al, Au, Ag, Ni, Ir, Mo, Pt and Pd.

8. The method of claim 1, further comprising selecting said metallic material for said at least two MeNWs from a group of materials that includes Cu, $Cu_xO_y$, Al, $Al_wCu_z$, Ag, Au, Pt and Pd, where w, x, y and z are positive numbers.

9. The method of claim 1, further comprising selecting said insulation material from a group of materials that includes Si, $Si_aO_b$ and $Si_cN_d$, where a, b, c and d are selected positive numbers.

10. The method of claim 1, further comprising selecting said thickness of said catalyst layer in a range 0.1–20 nanometers.

11. The method of claim 1, further comprising selecting said thickness of said conductive layer in a range 0.2–250 nm.

12. The method of claim 1, further comprising providing at least one of said at least two MeNWs with a diameter, measured in a plane substantially parallel to said plane Π, in a range 1–250 nm.

13. The method of claim 1, further comprising choosing said diffusion barrier material to be an electrically conductive material.

* * * * *